United States Patent [19]
François et al.

[11] Patent Number: 5,892,671
[45] Date of Patent: Apr. 6, 1999

[54] CONTROL CIRCUIT FOR A SWITCHING TRANSISTOR USING A TAPPED COIL WITH OPPOSITELY WOUND COIL PARTS

[75] Inventors: Yves François; Daniel Lopez, both of Villingen-Schwenningen; Gerard Rilly, Unterkirnach, all of Germany

[73] Assignee: Deutsche Thomson-Brandt GmbH, Villingen-Schwenningen, Germany

[21] Appl. No.: 783,228

[22] Filed: Jan. 14, 1997

[30] Foreign Application Priority Data

Jan. 25, 1996 [DE] Germany .................. 196 02 556.7

[51] Int. Cl.$^6$ .................................. H02M 7/537
[52] U.S. Cl. .................. 363/97; 363/20; 363/131
[58] Field of Search ................... 363/18, 19, 20, 363/21, 97, 131

[56] References Cited

U.S. PATENT DOCUMENTS 4,612,451  9/1986  Mackawa et al. ............... 307/270

FOREIGN PATENT DOCUMENTS 3300682  1/1986  Germany ............... H03K 17/60
2819225  10/1989 Germany ............... H02M 3/335
3844210  7/1990  Germany ............... H02H 7/12

OTHER PUBLICATIONS

JP Patent Abstracts of Japan: 4–96652 A., E–1235, Jul. 16, 1992. vol. 16, No. 326.
JP Patent Abstracts of Japan: 56–115175, A.,E– 85, Dec. 8, 1981, vol. 5, No. 192.

*Primary Examiner*—Jeffrey Sterrett
*Attorney, Agent, or Firm*—Joseph S. Tripoli; Frederick A. Wein; Marion P. Metelski

[57] ABSTRACT

A line deflection circuit for a television receiver or a switched-mode power supply operate with a switching transistor that is connected in series with the primary winding of a transformer and is periodically switched on and off by a switching voltage. In such a circuit, appreciable turn-on and turn-off losses, which reduce the overall efficiency of the circuit, are produced at the switching transistor, particularly at higher operating frequencies. Within a control circuit a DC voltage source is connected to the base of the switching transistor via a periodically actuated switch element and a coil having a core and a tap. The two parts of the coil are wound in opposite senses, and the tap is connected via a diode to ground or to the emitter of the switching transistor. The control circuit further includes a charge-reversal path via which, during a demagnetization phase of the coil, the energy stored in the coil in the form of a current is transferred in the form of a negative voltage to a capacitor that is coupled via a second diode to a first part of the coil. The negative voltage is applied during a residual time subsequent to the demagnetization phase as a reverse voltage to the base of the switching transistor.

17 Claims, 2 Drawing Sheets

CONTROL CIRCUIT FOR A SWITCHING TRANSISTOR USING A TAPPED COIL WITH OPPOSITELY WOUND COIL PARTS

FIELD OF THE INVENTION

The invention is based on a control circuit for a periodically actuated switching transistor. Such a switching transistor is required, for example, in the line output stage for a television receiver or in a switched-mode power supply.

BACKGROUND INFORMATION

Both line deflection circuits and switched-mode power supplies are increasingly employing higher operating frequencies, for the line deflection for high-definition systems at a line frequency of 32 kHz and for switched-mode power supplies in order to reduce the dimensions of the isolating transformer further. The turn-on and turn-off losses at the switching transistor increase proportionally with the increase in the operating frequency. Efforts are therefore being made to reduce these turn-on and turn-off losses at the switching transistor in order to improve the overall efficiency of the circuit.

SUMMARY

The present invention is directed to a control circuit for a switching transistor which enables the turn-on and turn-off losses at the switching transistor to be reduced.

A control circuit according to the inventive arrangements taught herein comprises a DC voltage source is connected to the base of the switching transistor via a periodically actuated switch element and a coil having a core and having a tap. The two coil windings defined by the tap are wound in opposite senses, and the tap is connected via a diode to earth or to the emitter of the switching transistor.

The inventive control circuit for the switching transistor has a number of advantages over known circuits. The circuit is particularly simple because it requires a few passive, inexpensive components. In particular, very rapid and lossless turning off of the switching transistor is achieved. The circuit in this case acts as a current transformer with just one inductor, while a genuine current transformer having a primary winding and secondary winding is not required. The base current during the on phase of the switching transistor is, in a desirable manner, proportional to the collector current of the switching transistor, that is to say it rises with a sawtooth waveform starting from zero during the on phase of the switching transistor. This dynamic matching of the base current to the collector current of the switching transistor reduces the losses at the switching transistor during this time and achieves a better efficiency. The circuit permits, particularly at elevated operating frequencies, a considerable reduction in the losses occurring at the switching transistor.

The turns ratio between the coil part connected to the switch and the coil part connected to the base of the switching transistor is preferably about 3:1. This dimensioning ensures an optimum amplitude of the negative base current of the switching transistor during the depletion phase.

In a development of the invention, that end of the first coil part which is connected to the switch element is connected to earth via the series circuit formed by a diode and a capacitor. In this case, the capacitor is connected via a resistor to the base of the switching transistor. In this circuit, the capacitor serves to discharge the coil after the depletion phase. In this case, the energy stored in the form of a current in the coil is transferred to this capacitor in the form of a voltage. The voltage occurring across the capacitor serves to switch off the switching transistor. The capacitor therefore advantageously fulfils two tasks, namely the acceptance of the energy in the coil after the depletion phase for the purpose of discharging the coil, and the provision of a negative voltage at the base of the switching transistor for this time.

The DC voltage source can also be formed by a rectifier circuit which is fed by a winding of a transformer which is controlled by the switching transistor. The overall circuit can thereby be simplified. A starting circuit may then be required for the purpose of starting the circuit. The switch can be formed by a transistor or a MOSFET.

BRIEF DESCRIPTION OF THE DRAWINGS

The invention is explained below with reference to the drawings, in which.

DESCRIPTION OF THE PREFERRED EMBODIMENTS

Figure 1:
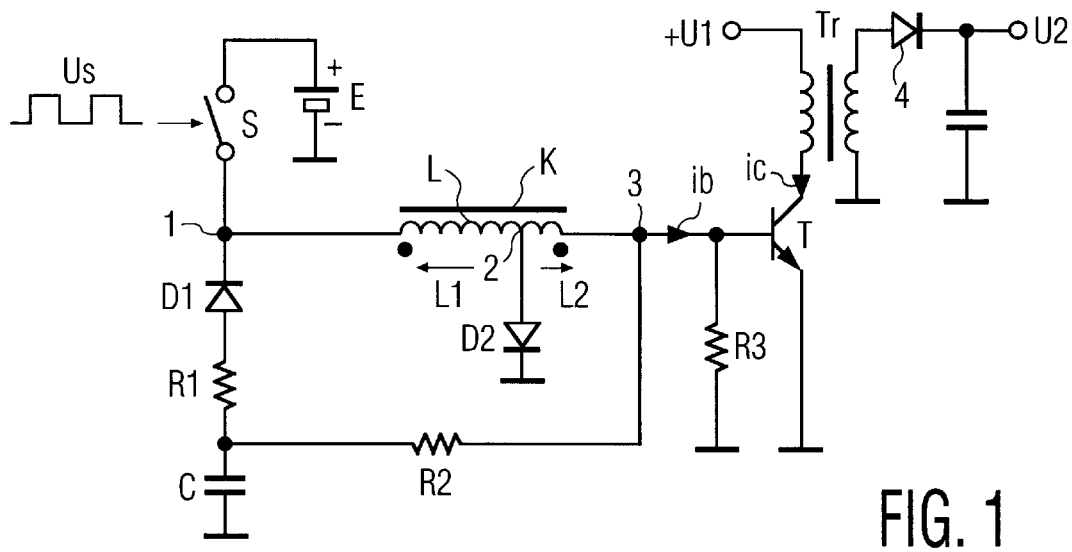
FIG. 1 shows an exemplary circuit for the circuit according to the invention.
Figure 2:
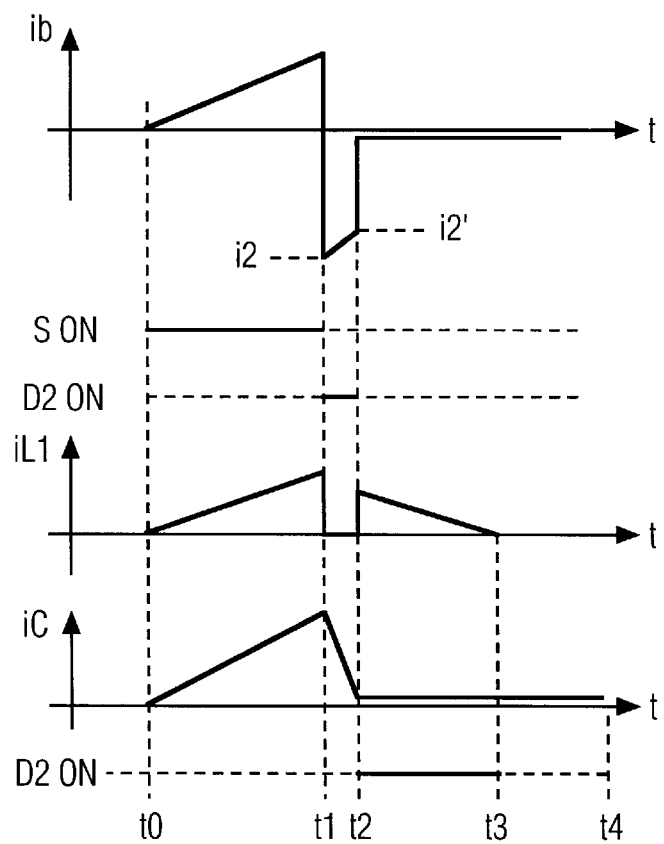
FIG. 2 shows waveforms for explaining the method of operation of the circuit according to FIG. 1.

The following symbols are used in the description.

ib Base current of the switching transistor
ic Collector current of the switching transistor
i1 Maximum value of the positive base current
i2 Maximum value of the negative base current
i2' Base current at the end of the depletion phase
n1 Number of turns of the coil part L1
n2 Number of turns of the coil part L2
UD Breakdown voltage of the diodes
Ube Base/emitter forward voltage of the switching transistor
U2 Operating voltage generated
Us Switching voltage FIG. 1 shows a switched-mode power supply with the switching transistor T, the isolating transformer Tr and the rectifier circuit 4 for generating an operating voltage U2. The isolating transformer Tr preferably contains a plurality of secondary windings for generating operating voltages of varying amplitude and polarity. The switching transistor T is periodically switched on and off by a control or driver circuit. The control circuit contains the voltage source E, the switch S, which is periodically actuated by the switching voltage Us, the coil L having the core K and the two coil parts L1 and L2, which are wound in opposite senses, and a tap 2, which is earthed via the diode D2. The tap 1, which is connected to the switch S, of the coil L is connected to earth via the series circuit formed by the diode D1, the resistor R1 and the capacitor C, the capacitor C being connected via the resistor R2 to the base of the switching transistor T. The base of the latter is connected to earth via the-resistor R3.

Figure 5:
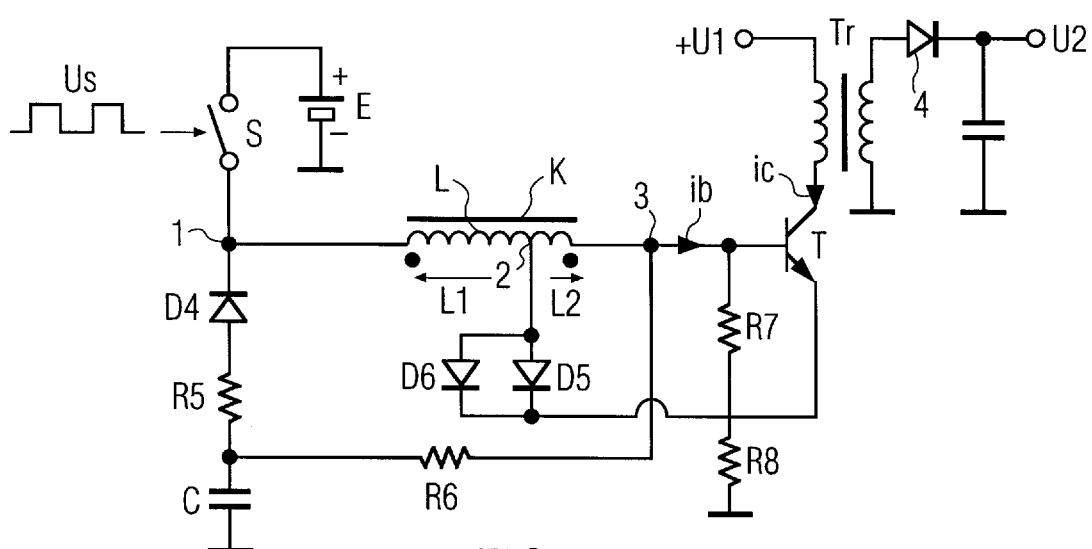
FIG. 5 shows an alternative embodiment for the circuit according to FIG. 1.

FIG. 5 shows an alternate embodiment of the circuit according to FIG. 1. In this alternate embodiment, the tap 2 is coupled via the parallel diodes D5 and D6 to the emitter of the switching transistor T.

The method of operation of the control circuit is described below, with reference to FIGS. 1 an 2, successively for the different operations during an operating period.

On phase of the switching transistor T from t0–t1

Let it be assumed that the circuit has zero current and zero voltage at the instant t0 at the beginning of the operating period. At t0, the switch S is closed by the switching voltage Us, with the result that the positive voltage E is present at the tap 1 of the coil L. Consequently, a base current ib begins to flow via the coil L into the base of the switching transistor T, which base current ib rises with a sawtooth waveform on account of the inductance of the coil L and produces a proportional collector current ic through the switching transistor T. As a result of the reciprocal winding of the two coil parts L1, L2, a negative voltage is present at the tap 2 of the coil L, with the result that the diode D2 is switched off during this time.

Depletion phase from t1–t2

The switch S is opened by the switching voltage Us at the instant t1 at the beginning of the depletion phase. No more current can then flow into the tap 1 of the coil L. The magnetization is now completely concentrated in the coil, the magnetization current initially having to flow further. A large negative base current ib now flows from the base of the switching transistor T via the coil part L2 between the taps 2 and 3 and the diode D2, which is now switched on, to earth. The magnetization changes relatively slowly from the value i2 to the value i2'. The coil L is still not completely discharged, however, at the end of the depletion phase, that is to say at the instant t2.

Discharge of the coil L or demagnetization phase

The base of the switching transistor T is now finally discharged, i.e. all of the charge carriers are depleted and the collector current ic has decayed to zero. The impedance at the base now rises appreciably, with the result that no more appreciable current can flow into the base. The current still flowing in the coil L must therefore find another path. This current now flows from the capacitor C via the resistor R1, the diode D1, the coil part L1 between the taps 1 and 2 and the diode D2. At the instant t3, the coil L is completely discharged, i.e. the energy stored in the form of the current in the coil L has been transferred to the capacitor C in the form of a negative voltage.

Residual time during the operating period

During the residual time t3–t4 of the operating period t0–t4, in which all of the currents have decayed to zero, the negative voltage produced across the capacitor C by the demagnetization of the coil L is present at the base of the switching transistor T and ensures that the latter continues to be in the off state. The capacitor C serving for the discharge of the coil L therefore simultaneously makes the negative voltage produced by its discharge available to the base of the switching transistor T as a reverse voltage. At the instant t4, which corresponds to the instant t0, the circuit is thus prepared at the beginning of the next operating period by the closing of the switch S.

Figure 3:
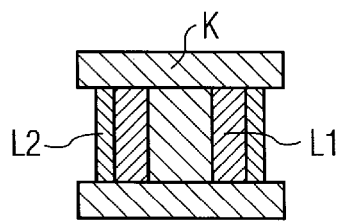
FIG. 3 shows the structure of the coil with the core.

FIG. 3 shows the core K with the two coil parts L1, L2 designed as layer windings. The core K is designed as a so-called roller-type or mushroom-type core.

Figure 4:
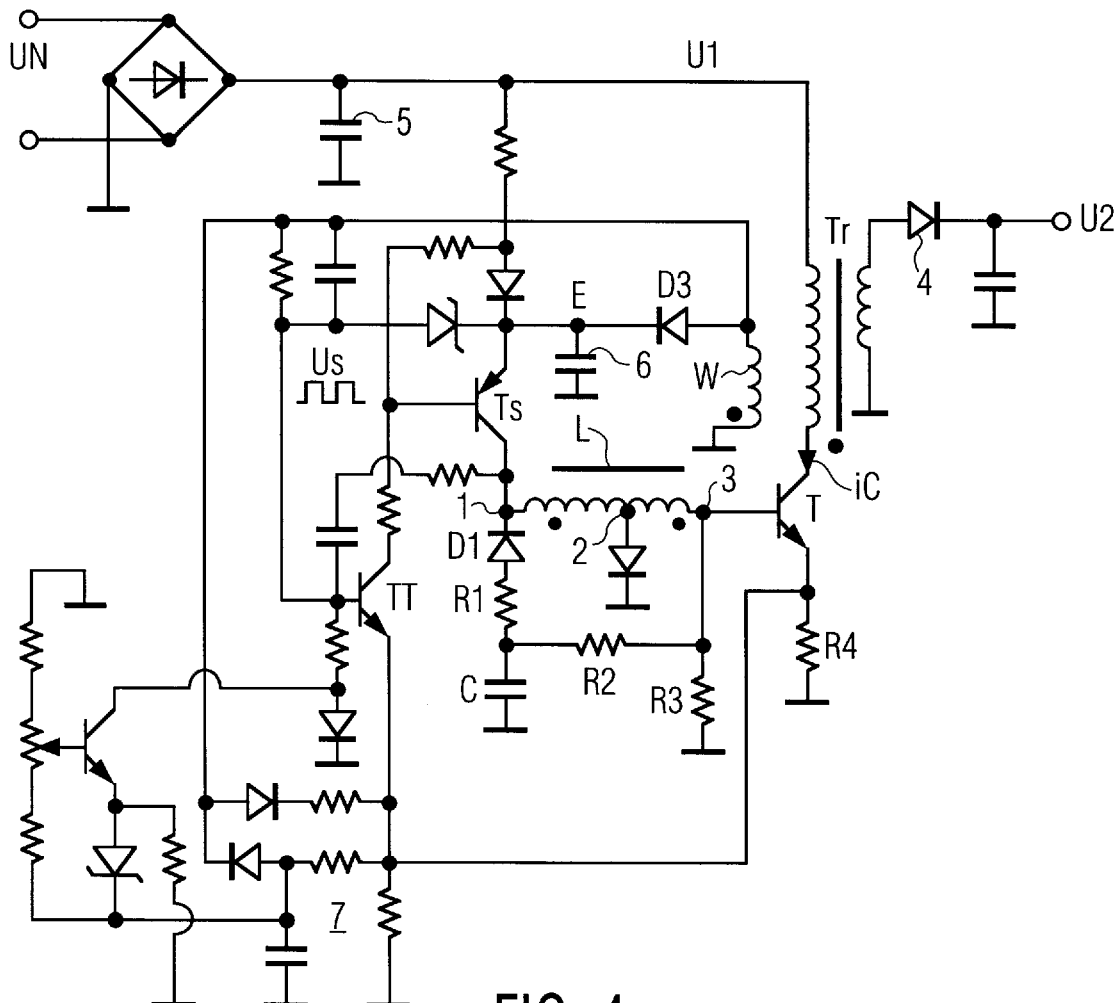
FIG. 4 shows an exemplary embodiment of the circuit according to FIG. 1.

FIG. 4 again shows the components of FIG. 1. The operating voltage U1 for the switching transistor T is obtained from the power supply voltage UN via the power supply rectifier 4 and the charging capacitor 5. The positive voltage E is obtained by rectification of the pulse voltage present at the winding W by means of the diode D3 and the capacitor 6. The current measuring resistor R4 in the emitter path of the switching transistor T supplies a voltage which is proportional to the collector current ic and, by way of the threshold value circuit 7, causes the switching transistor T to switch off at a specific collector current ic. The switch S of FIG. 1 is formed by the transistor Ts and the switching voltage Us for the transistor Ts is generated by virtue of the fact that the switched-mode power supply illustrated is of free-running design as a result of the winding W. The transistor TT forms a driver circuit for the transistor Ts.

In an exemplary embodiment which was tried and tested in practice, the components had the following values:

| | |
|---|---|
| Capacitor C: | 10 nF |
| Resistor R1: | 47 ohms |
| Resistor R2: | 470 ohms |
| Resistor R3 | 470 ohms |
| Resistor R4 | 0.2 ohm |
| Transistor Ts: | Type BC369 |
| n1: | 40 turns |
| n2: | 13 turns |
| K: | Roller-type or mushroom-type core |

We claim:

1. A control circuit for a periodically actuated switching transistor, which is connected in series with the primary winding of a transformer to an operating voltage, wherein a DC voltage source is connected to the base of the switching transistor via a periodically actuated switch element and a coil having a core and a tap between first and second coil parts, the first and second coil parts are wound in opposite senses, and the tap is connected via a first diode to earth or to the emitter of the switching transistor.

2. A circuit according to claim 1, wherein the turns ratio between the first coil part connected to the switch element and the second coil part connected to the base of the switching transistor is about 3:1.

3. A Circuit according to claim 1, wherein a charge-reversal path is provided via which, during a demagnetization phase of the coil, the energy stored in the form of a current in the coil is transferred to a capacitor in the form of a negative voltage, said negative voltage being applied during a succeeding residual time of the operating period as a reverse voltage to the base of the switching transistor.

4. A circuit according to claim 3, wherein a terminal of the first coil part is connected to earth via a series circuit formed by a second diode and the capacitor.

5. A circuit according to claim 4, wherein the capacitor is connected via a first resistor to the base of the switching transistor.

6. A circuit according to claim 5, wherein a second resistor is connected in series with the diode.

7. A circuit according to claim 1, wherein the DC voltage source is formed by a rectifier circuit which is fed by a winding of a transformer which is controlled by the switching transistor.

8. A control circuit for periodically actuating a switching transistor which is connected in series with a primary winding of a transformer, said control circuit comprising:
   a DC voltage source;
   a periodically actuated switch element coupled to said DC voltage source;
   a coil for coupling said switch element to a first electrode of said switching transistor, said coil having a tap for dividing said coil into first and second coil parts, which coil parts are wound in opposite senses;
   a first diode for coupling said tap to a reference voltage potential of said switching transistor; and a charge-reversal path for transferring the energy stored in said coil to a capacitor during a demagnetization phase of said coil;

wherein:

said capacitor is coupled to said first coil part via a second diode and a first resistor; and said capacitor is further coupled via a second resistor to the first electrode of said switching transistor, said negative voltage of said capacitor being applied as a reverse voltage to the first electrode of said switching transistor subsequent to the demagnetization phase of said coil.

9. A control circuit for periodically actuating a switching transistor that is coupled in series with a primary winding of a transformer, said control circuit comprising:

a DC voltage source;

a periodically actuated switch element coupled to said DC voltage source;

a coil for coupling said switch element to a first electrode of said switching transistor, said coil having a tap for dividing said coil into first and second coil parts, which coil parts are wound in opposite senses;

a first diode for connecting said tap to a reference voltage potential of said control circuit; and a charge-reversal path for transferring the energy stored in said coil to a capacitor during a demagnetization phase of said coil, said energy being stored by said capacitor as a negative voltage which is coupled to said first electrode of said switching transistor.

10. A control circuit according to claim 9, wherein the turns ratio between the first coil part and the second coil part is approximately 3:1.

11. A control circuit according to claim 9, wherein the DC voltage source is formed by a rectifier circuit which is fed by a winding of a transformer which is controlled by the switching transistor.

12. A control circuit according to claim 9, wherein said capacitor is coupled via a second diode to said first coil part.

13. A control circuit for periodically actuating a switching transistor that is coupled in series with a primary winding of a transformer, said control circuit comprising:

a DC voltage source;

a periodically actuated switch element coupled to said DC voltage source;

a coil for coupling said switch element to the base of said switching transistor, said coil having a core and a tap for dividing said coil into first and second coil parts, which coil parts are wound in opposite senses;

a first diode for connecting said tap to a ground potential of said control circuit; and a charge-reversal path for transferring the energy stored in the form of a current in said coil to a capacitor during a demagnetization phase of said coil, said energy being stored by said capacitor as a negative voltage, said voltage being applied as a reverse voltage to the base of said switching transistor during a residual time subsequent to said demagnetization phase of the operating period of the switching transistor.

14. A control circuit according to claim 13, wherein the terminal of the first coil part that is connected to the switch element is also connected to ground via a series circuit formed by a second diode and said capacitor.

15. A control circuit according to claim 14, wherein the capacitor is connected via a first resistor to the base of the switching transistor.

16. A control circuit according to claim 15, wherein a second resistor is connected in series with the second diode.

17. A control circuit for periodically actuating a switching transistor that is coupled in series with a primary winding of a transformer, said control circuit comprising:

a DC voltage source;

a periodically actuated switch element coupled to said DC voltage source;

a coil for coupling said switch element to a first electrode of said switching transistor, said coil having a tap for dividing said coil into first and second coil parts, which coil parts are wound in opposite senses;

a first diode for connecting said tap to a second electrode of said switching transistor; and a charge-reversal path for transferring the energy stored in said coil to a capacitor during a demagnetization phase of said coil, said capacitor being coupled via a second diode to said first coil part, and said energy stored in said capacitor as a negative voltage which is coupled to said first electrode of said switching transistor.

* * * * *